United States Patent
Aumueller

(10) Patent No.: US 7,973,634 B2
(45) Date of Patent: Jul. 5, 2011

(54) ELECTRONIC COMPONENT AND METHOD FOR FIXING THE SAME

(75) Inventor: Rupert Aumueller, Hengersberg (DE)

(73) Assignee: Wuerth Elektronik Ibe GmbH, Thymau (DE)

( * ) Notice: Subject to any disclaimer, the term of this patent is extended or adjusted under 35 U.S.C. 154(b) by 0 days.

(21) Appl. No.: 11/920,340

(22) PCT Filed: May 5, 2006

(86) PCT No.: PCT/EP2006/004206
§ 371 (c)(1),
(2), (4) Date: May 13, 2008

(87) PCT Pub. No.: WO2006/122660
PCT Pub. Date: Nov. 23, 2006

(65) Prior Publication Data
US 2009/0058590 A1    Mar. 5, 2009

(30) Foreign Application Priority Data

May 13, 2005   (DE) .......................... 10 2005 022 927

(51) Int. Cl.
*H01F 27/30* (2006.01)
*H01F 27/24* (2006.01)
*H01F 17/04* (2006.01)
*H01F 27/28* (2006.01)
*H01F 7/06* (2006.01)
*H05K 3/30* (2006.01)
*H01R 43/00* (2006.01)

(52) U.S. Cl. ........ 336/205; 336/213; 336/221; 336/222; 29/832; 29/883; 29/602.1; 29/605

(58) Field of Classification Search .................. None
See application file for complete search history.

(56) References Cited

U.S. PATENT DOCUMENTS

| 620,564 A |  | 3/1899 | Bubb |  |
|---|---|---|---|---|
| 2,722,662 A | * | 11/1955 | Tyminski | 336/20 |
| 3,196,523 A | * | 7/1965 | Bell | 29/605 |
| 3,399,364 A | * | 8/1968 | Barber | 336/107 |
| 3,739,312 A | * | 6/1973 | Knebel | 336/192 |
| 3,745,498 A | * | 7/1973 | Hagood | 336/65 |
| 3,824,518 A | * | 7/1974 | Slenker | 336/96 |
| 4,193,185 A |  | 3/1980 | Liautaud |  |

(Continued)

FOREIGN PATENT DOCUMENTS

CN    1308402 A    8/2001

(Continued)

*Primary Examiner* — Anh T Mai
*Assistant Examiner* — Mangtin Lian
(74) *Attorney, Agent, or Firm* — Boyle Fredrickson, S.C.

(57) ABSTRACT

Disclosed is an electronic component, especially a coil with a coil core, in which the turns of the coil winding are spaced apart from each other at least at one point in the longitudinal direction of the coil. A plastic retaining element which overlaps both the coil core and at least the two adjacent turns of the coil winding in a longitudinal direction is sprayed on in the area of said point, whereby a connection between the coil core and the coil winding is created at the same time. The retaining element can be sprayed around a closed circumference of the coil while covering only a portion of the coil in the longitudinal direction thereof. Preferably, the retaining element is placed approximately in the center relative to the longitudinal extension of the coil.

21 Claims, 2 Drawing Sheets

U.S. PATENT DOCUMENTS

Figure 1:
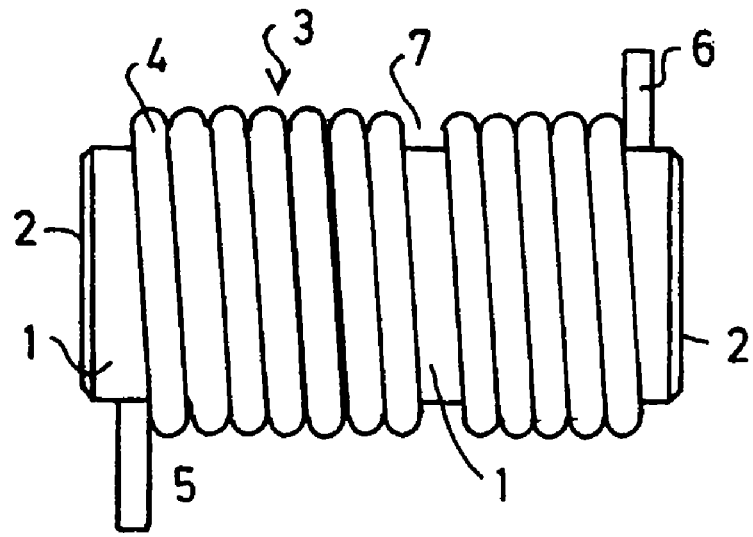

| | | | |
|---|---|---|---|
| 4,255,735 A * | 3/1981 | Liautaud | 336/192 |
| 4,264,675 A * | 4/1981 | Liautaud | 428/376 |
| 4,695,927 A | 9/1987 | Barre | |
| 4,866,573 A * | 9/1989 | Bernstein | 361/782 |
| 4,980,663 A * | 12/1990 | Moyer | 334/8 |
| 5,307,041 A | 4/1994 | Kato et al. | |
| 5,867,891 A | 2/1999 | Lampe, Jr. et al. | |
| 6,205,646 B1 * | 3/2001 | Thibado | 29/602.1 |
| 6,449,830 B1 * | 9/2002 | Amada et al. | 29/605 |
| 6,727,792 B2 * | 4/2004 | Amada et al. | 336/192 |
| 6,940,366 B2 * | 9/2005 | Komiya | 333/181 |
| 7,167,068 B2 * | 1/2007 | Nakano et al. | 336/120 |
| 2001/0004230 A1 * | 6/2001 | Thibado | 336/208 |
| 2003/0071395 A1 | 4/2003 | Brooks et al. | |

FOREIGN PATENT DOCUMENTS

| | | |
|---|---|---|
| DE | 37 10 184 A1 | 10/1988 |
| DE | 43 40 594 A1 | 6/1994 |
| DE | 94 10 532 U | 8/1994 |
| DE | 94 20 283.4 | 5/1995 |
| DE | 196 41 863 C1 | 3/1998 |
| DE | 299 03 709 U1 | 5/1999 |
| DE | 198 04 757 A1 | 8/1999 |
| DE | 198 12 836 A1 | 9/1999 |
| DE | 199 17 580 A1 | 10/2000 |
| DE | 101 29 163 A1 | 1/2003 |
| DE | 103 22 628 A1 | 5/2003 |
| JP | 55 151 309 A | 11/1980 |
| WO | WO 96/19814 | 6/1996 |

* cited by examiner

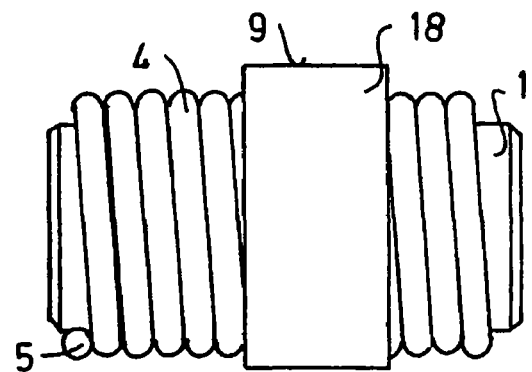
FIG. 4
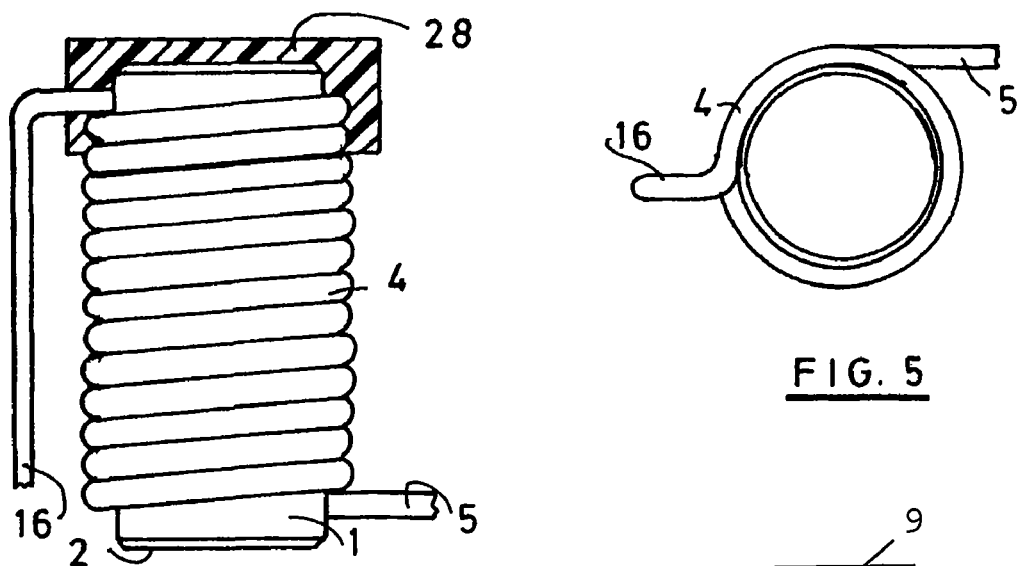
FIG. 6
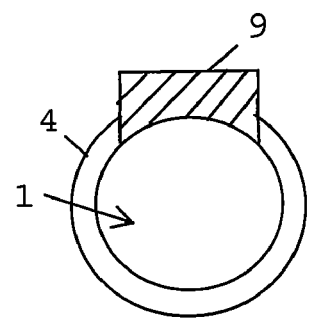
FIG. 5
FIG. 7

ELECTRONIC COMPONENT AND METHOD FOR FIXING THE SAME

The invention relates to an electronic component, especially a coil and a method for its manufacture.

Coils with coil cores are often required in electronics. They are implemented and fixed in components, printed circuit boards or in other arrangements. Placement and fixing often takes place with the help of devices that grasp the coils and place them at the required place. After placing, they can, for instance, automatically be soldered to establish the electrical connection.

When moving the coil with the help of automatic appliances very high speeds can occur and especially also jerky accelerations. Upon the occurrence of jerky accelerations the danger exists that the coil cores may be thrown out of the coil winding. Commonly, the coil cores are a bit longer than the coil winding, but grasping with automatic appliances generally occurs in the middle of the longitudinal extension of the coil—thus on the coil winding.

To enable grasping on the coil winding, it is already known to attach a small plate made of plastic, with the help of an adhesive, which can involve the encapsulating material to be applied on the top side of the coil winding (DE 9410532).

The task of the invention is to form an electronic component in such a manner that it is particularly suitable for automatic assembly.

To solve this task, the invention proposes a component with the features mentioned in claim 1 and/or a method with the features of claim 11. Further developments of the invention are object of dependent claims.

The component can by grasped by using a grasper on the holding element, and moved to the assembly point.

The electronic component can be a capacitor, for example. Particularly, the invention is suitable for fastening coils.

In the normal case the windings of the coil lie adjacent to one another in order to occupy little space as possible. Now, it is provided according to the invention that, at a point between two sections of winding or also between two adjacent windings, a gap is provided for instance in longitudinal direction of the coil. Through this gap the coil core is open outwards so that the holding element can be connected both with the coil core as well as with the two adjacent coil windings. The holding element made of plastic is injection-molded at this point. It connects itself with the coil core and with the neighboring windings. Through this, a permanent connection between the coil core and the coil winding established so that the initially mentioned difficulties can no longer occur.

For an automatic assembly, the coils are generally formed such that they allow one to see which side of the coil is meant to be the assembly side on the printed circuit board. This can be identified, for instance, in that the two connection ends of the coil winding run tangentially to the coil core and lie in one plane. The invention now proposes that the holding element is injection-molded on the side turned away from the assembly side of the coil.

Thus, expressed otherwise, this allows that the holding element is injection molded from this side. This results in that the holding element can also be used to form an action point for a gripping device, for instance for a suction pipette.

According to the invention it can be provided in a further development that the holding element extends at least over a part of the circumference of the coil.

In yet another further development of the invention it can be provided that the holding element only extends over a part of the length of the coil. Thus, the rest of the coil, particularly of the coil winding, remains free of the material of the holding element so that no restrictions occur with regard to the heat dissipation capability.

It can, however, also be provided that the holding element extends over an entire circumference of the coil so that it is therefore injection-molded around the coil.

In yet another further development of the invention, it can be provided that the holding element features a plane surface on the side turned away from the assembly side of the coil. This plane surface is meant and is suitable for being held by means of a grasper.

According to the invention it can likewise be provided that the holding element is injection-molded from a plastic that develops an adhesive effect at higher temperatures, for instance at a temperature that corresponds to the soldering temperature. This leads to the effect that, during its electrical connection via the soldering process, the coil is concurrently additionally connected mechanically with the printed circuit board at a further point.

For the manufacture of the coil, the invention proposes that first from the wire the coil winding is made in such a manner that said coil features a gap at least at one point between two adjacent windings in the longitudinal direction. Thereafter, in this coil winding, a coil core is inserted and the unit comprising the coil winding and the core is introduced into an injection die. In this injection die, many similar units of coil winding and coil core can be introduced. Finally, at the said point of the gap between the two windings and the two adjacent windings, the holding element itself is injection-molded.

Figure 2:
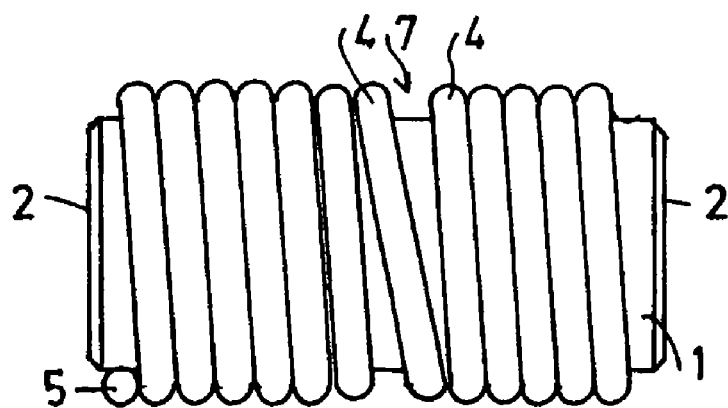
Figure 3:
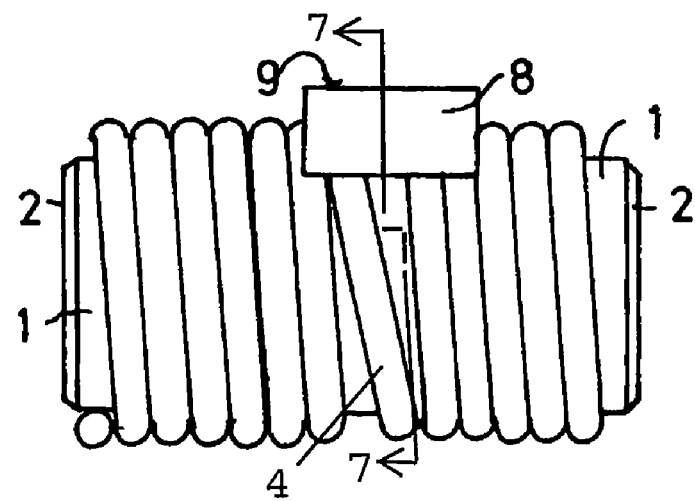

Further features, details, and preferences of the invention are derived from the claims and the abstract, whose wording refers to the content of the description, and to the following description of a preferred embodiment as well as to the drawing. The following figures show:

FIG. 1: a view of a coil winding with a coil core from the direction turned away from the assembly side of the coil;

FIG. 2: the view of the coil of FIG. 1 from the bottom in FIG. 1;

FIG. 3: the view of the coil corresponding to FIG. 2 with an attached holding element;

FIG. 4: an illustration corresponding to FIG. 3 for the second embodiment.

FIG. 5: a plan view of a coil to be vertically mounted.

FIG. 6: a side view of the coil according to FIG. 5 with a partially sectioned illustration of the holding element.

FIG. 7 is a detail sectional view taken in the plane indicated by line 7-7 in FIG. 3.

FIG. 1 shows a coil with a coil core 1, for instance made of ferrite. The coil core 1 is formed as a circular cylindrical rod. It contains two plane end faces 2. The coil core 1 is surrounded by a coil winding 3, which features numerous adjacent coil windings 4. The two ends 5, 6 of the coil winding 3 are tangentially led away from the coil core 1. The two ends 5, 6 can also be longer, the illustration is only schematically considered. They lie in one plane. This plane depicts the assembly side of the coil.

The windings 4 of the coil winding 3 are wound at a point 7 such that they feature a gap in the longitudinal direction of the coil. This forms a gap through which a part of the surface of the coil core 1 is visible.

FIG. 2 shows the view of the coil of FIG. 1 from below in FIG. 1, thus from a direction offset by 90°. Here, one sees how the gap between two adjacent windings 4 occurs. The pitch of the windings is enlarged at this point and finally led back to the normal value.

The unit depicted in FIGS. 1 and 2 of the coil core 1 and coil winding 3 is placed in an injection die, together with a plurality of other similar units. In this injection die, a holding element 8 is injection-molded onto the point 7 of the gap between two adjacent windings 4 of the coil winding 3. The top side 9 of the holding element 8 as visible in FIG. 3 is formed plane. In longitudinal direction, the holding element 8 extends over the gap between adjacent windings and at least over the two adjacent windings themselves, preferably still up into the depression between the next windings. The holding element 8 is made of injected plastic and is connected with the core 1 and the coil windings. Through this the coil winding 3 is also connected with the core 1. As for the embodiment of FIG. 3 the holding element 8 extends in the circumferential direction only via a part of the coil.

FIG. 4 depicts an embodiment in which the holding element 18 is injection molded around the entire circumference of the coil. Again, the side of the holding element 18 is turned away from the assembly side, at the bottom in FIG. 4, where it is provided with a plane surface 9 on which a gripper can act.

In the case of both embodiments the holding element 8, 18 only extends over a part of the length of the coil so that the rest of the coil windings 3 remain free and can dissipate their heat content.

The attachment of a holding element 8, 18 on an electronic component was described using a coil as an example. The attachment of such a holding element can also occur for other electronic components.

The holding element 18 depicted in FIG. 4 can be injection-molded from a plastic that develops an adhesive effect at a temperature corresponding to the soldering temperature. When the coil is placed on the printed circuit board and then finally soldered, with the help of the holding element 18 it will be bonded together with the surface of the printed circuit board. This leads to a particularly good mechanical safety of the coil on the printed circuit board. This type of connection by means of a holding element made of a plastic that generates an adhesive effect at a higher temperature can also find application for other electronic components, but not for coils with a coil core.

What was depicted in FIGS. 1 to 4 for a horizontal configuration of coils is obviously also possible for the upright configuration of coils. In the case of horizontal configuration the axis of the coil core and the coil winding is aligned parallel to the surface on which the coil is mounted. In the case of upright configuration the axis is aligned perpendicularly to the surface. Even with the upright configuration it is possible to align the holding element as it is depicted in FIGS. 1 to 3. Even then can a grasper hold the contact surface 9 of the holding element and place the coil at the right place.

It is, however, likewise possible to attach the holding element at a different point. This should be depicted with reference to FIG. 5 and FIG. 6. FIG. 5 shows a face view of a coil in which the face surface 2 of coil core 1 is visible. The two ends 5, 16 of the coil winding are arranged differently here contrary to how this was depicted in the preceding embodiments. While connection end 5 still runs tangentially to the coil core 1, the connection end 16 is aligned radially outwards and from there it is bent downwards; see the side view of FIG. 6. Whilst FIG. 5 still shows the coil with coil core prior to the injection molding of the holding element, FIG. 6 shows a side view with a holding element 28 injection-molded on it, which is depicted here in a sectional view. As one can still derive from FIG. 5, here the winding 4 sections of the coil winding are arranged such that the core 1 between them is free. One can injection mould a holding element 28 at this point which then extends laterally so far that it then overlaps the top-most coil winding 4. This also leads to having the coil winding 3 fixed against displacement on the core 1.

The holding element 28 can enclose the face end of the coil, for instance, when turned away from the mounting surface around the entire circumference so that it forms a kind of cover. However, it can also be sufficient that this holding element 28 only extends in the section of a diameter above the face end, so that free parts remain on the right and left side.

Also in the type of configuration of FIG. 6, the holding element, in the embodiment according to FIG. 4, can similarly reach up to a point on the lower face surface 2 in FIG. 6 if one intends to attain the same fixing type as in the case of the embodiment according to FIG. 4.

What was depicted with reference to FIGS. 4 to 6 as an example for one coil can also be applied to another electronic component, for instance, to capacitors that likewise feature connection ends, and in which the components can be mounted with both the help of a grasper as well as adhesion during soldering.

The invention claimed is:

1. An electronic component which is formed for automatic mounting and comprises a holding element (8, 18, 28) which is made of plastic and which is injection molded on the electronic component and which is formed as a holding point for a grasper;

wherein the electronic component is formed as a coil with a coil core (1) and with a coil winding (3) that surrounds the coil core (1) and includes a plurality of individual coils (4) extending between at least two connection ends (5, 6);

wherein the coil core 1) is provided without end flanges for preventing the coil core (1) from sliding within the coil winding (3);

wherein a gap (7) is provided between two spaced apart adjacent coils among the plurality of individual coils (4) of the coil winding (3) in the longitudinal direction of the coil winding (3), and wherein the holding element (8, 18) is attached as an injection molded body that contacts the coil core (1) and bridges the gap (7) between the two spaced apart adjacent coils (4), and wherein the holding element (8, 18, 28) grips both the coil core (1) and the two spaced apart adjacent coils (4) in the gap and intermediate opposite ends of the coil winding (3) to prevent longitudinal movement of the core relative to the coil winding; and wherein the gap between the two spaced apart adjacent coils is provided at only one location along the length of the coil core, with the other coils being adjacent to one another and providing no additional gap.

2. A component according to claim 1, wherein the holding element (8, 18) is located on a side of the coil turned away from the assembly side of the coil.

3. A component according to claim 1, wherein the holding element (8, 18) extends over at least one part of the circumference of the component.

4. A component according to claim 1, wherein the holding element (8, 18) extends over at least one part of the circumference of the component.

5. A component according to claim 1, wherein the holding element (18) extends over the entire circumference of the component.

6. A component according to claim 1, wherein the holding element (8, 18) features a plane surface (9) on the side of the component turned away from the assembly side.

7. A component according to claim 1, wherein the holding element (8, 18) is injection molded from plastic that develops an adhesive effect at soldering temperatures.

8. A component according to claim 1, wherein the plurality of individual coils has an increased pitch in the area of the gap in relation to a pitch of the adjacent coils on opposite sides of the gap.

9. A component according to claim 8, wherein the holder extends over only a portion of the coil winding to allow heat dissipation from the coils.

10. A component according to claim 1, wherein the holder extends over only a portion of the coil winding to allow heat dissipation from the coils.

11. A method for making an electronic component, the method comprising:
   molding a holding element on the electronic component by injection molding, wherein on the holding element a contact surface for a grasper is formed; and
   moving the electronic component to an assembly point by using a grasper acting on the contact surface of the holding element; and
   wherein the electronic component has a coil winding and a coil core and wherein a gap is provided between two pluralities of individual coils in the coil winding,
   wherein the coil core is provided without end flanges for preventing the coil core from sliding out of the coil winding; and
   wherein the coil winding is positioned during the injection molding such that when plastic is injected, the holding element is formed across the gap and is formed in contact with the coil core in the gap and in contact with the two pluralities of individual coils on opposite sides of the gap to prevent the coil core from sliding out of the coil winding.

12. A method according to claim 11, wherein the holding element (8, 18) is injection molded on the side of the component turned away from the assembly side of the component.

13. A method according to claim 11, wherein the holding element (8, 18) is injection molded over at least one part of the circumference of the component.

14. A method according to claim 11, wherein the holding element (8, 18) is injection molded over only one part of the length of the component.

15. A method according to claim 11, wherein the holding element (18) is injection molded around the entire circumference of the component.

16. A method according to claim 11, wherein the holding element (8, 18) is provided with a plane surface (9) on the side turned away from the assembly side of the component.

17. A method according to claim 11, wherein the holding element is injection molded from plastic that develops an adhesive effect at a temperature corresponding to the soldering temperature.

18. A method according to claim 11, wherein the plurality of individual coils is provided with an increased pitch in the area of the gap in relation to a pitch of the adjacent coils on opposite sides of the gap.

19. A method according to claim 18, wherein the holder is molded to extend over only a portion of the coil winding to allow heat dissipation from the coils.

20. A method according to claim 11, wherein the gap between the coils is provided at only one location along the length of the coil core, the other coils being adjacent to one another and providing no additional gap.

21. A method according to claim 20, wherein the holder is molded to extend over only a portion of the coil winding to allow heat dissipation from the coils.

* * * * *